United States Patent

Eichmann et al.

[11] Patent Number: 5,630,879
[45] Date of Patent: May 20, 1997

[54] METHOD AND APPARATUS FOR THE PARTIAL COATING OF SETS OF STRUCTURAL COMPONENTS

[75] Inventors: Wolfgang Eichmann, Puchheim; Martin Thoma, Munich; Horst Pillhoefer, Roehrmoos; Johannes Hartung; Karl-Heinz Helling, both of Dresden, all of Germany

[73] Assignee: MTU Motoren- und Turbinen-Union Muenchen GmbH, Munich, Germany

[21] Appl. No.: 503,705

[22] Filed: Jul. 18, 1995

[30] Foreign Application Priority Data

Jul. 22, 1994 [DE] Germany ............... 44 25 991.3

[51] Int. Cl.⁶ ............... C23C 16/00; C23C 14/04; C23C 14/56
[52] U.S. Cl. ............... 118/720; 118/730; 118/719; 118/721; 118/500; 118/504; 118/505; 204/298.23; 204/298.25; 204/298.26; 204/298.28
[58] Field of Search ............... 118/730, 715, 118/719, 720, 721, 500, 504, 505; 204/298.23, 298.25, 298.26, 298.28

[56] References Cited

U.S. PATENT DOCUMENTS

| | | | |
|---|---|---|---|
| 1,937,439 | 11/1933 | Schacht | 118/500 |
| 2,816,523 | 4/1957 | Johnson | 204/298.25 |
| 2,922,721 | 1/1960 | Tarkan | 118/500 |
| 3,097,104 | 7/1963 | Free | 118/505 |
| 3,699,917 | 10/1972 | Deverse | 118/720 |
| 5,421,979 | 6/1995 | Stevenson | 204/298.25 |
| 5,565,035 | 10/1996 | Sylvestro | 118/721 |

FOREIGN PATENT DOCUMENTS

| | | | |
|---|---|---|---|
| 3611492 | 10/1987 | Germany. | |
| 4222210 | 8/1993 | Germany. | |
| 4215664 | 11/1993 | Germany. | |
| 59-144121 | 8/1984 | Japan | 118/730 |

Primary Examiner—Richard Bueker
Assistant Examiner—Jeffrie R. Lund
Attorney, Agent, or Firm—W. G. Fasse; W. F. Fasse

[57] ABSTRACT

Structural components (2), such as turbine blades (16) partially to be coated, for example with precious metal coatings, are inserted into a circumferential pocket on a carrier wheel (8), so that surface areas (10, 10A) protruding radially outwardly are presented for a coating operation, for example by vapor deposition, gas diffusion, plasma spraying, or sputtering, while surface portions (9) of the components within the wheel are protected against coating by wheel disks (8A, 8B). The wheel is rotated either continuously or stepwise through an active coating chamber (3). Surfaces to be coated participate in forming first and second walls for enclosing a coating space (11). Other walls of the space (11) are formed by one or two coating sources (12, 13), such as cathode sputterers, whereby the need for screens or masks (4, 14) that form the remaining walls of the space (11) are minimized. The bottom (59) of the space (11) is preferably formed by wall portions (4A) of the turbine blades (16).

16 Claims, 3 Drawing Sheets

METHOD AND APPARATUS FOR THE PARTIAL COATING OF SETS OF STRUCTURAL COMPONENTS

FIELD OF THE INVENTION

The invention relates to a method and apparatus for the partial coating of structural components such as turbine blades which are arranged in groups or sets in a reaction chamber provided with screens or masks to protect component surface areas that are not supposed to be coated against deposition of coating material.

BACKGROUND INFORMATION

Such devices and methods employ vapor deposition, gas diffusion, plasma spraying, or deposition by sputtering in a respective apparatus. One type of such apparatus comprises a rotatable platform carrying in turn rotatable disks on which sets of structural components or individual components are positioned for the coating operation. The rotatable disks on the platform make sure that a uniform coating is achieved for sets of components or for each individual component. The rotatable platform in turn makes sure that the set of components or the individual components can be transported into different stations of the coating apparatus. A disadvantage of the just described apparatus is seen in that where a partial coating is intended, it is necessary to mask the component surfaces that are not to be coated. The application of such masking either by cover screens or by protective coatings is very cost intensive since manual labor is involved.

Yet another disadvantage of the known devices and methods is seen in that the consumption of coating material is rather high because the masking and any other covers and the large surface areas of the walls of the coating chamber are also coated. As a result, any attempt to recover coating material involves a high technical effort and expense, especially with regard to the large surface areas of the chamber and of the maskings which are coated only with very thin coating layers. Such thin layers are difficult to recover.

The above difficulties encountered with conventional coating devices and methods are especially disadvantageous where propulsion plant blades, such as turbine blades are to be coated with precious metals. Due to strength considerations, blades for a rotor disk may not be coated on the foot surfaces nor on the radially inwardly facing platform surface which merges directly into the foot area. Moreover, the cross-section of the blade foot has a complex, multi-dovetailing cross-sectional configuration which can be effectively protected against coating only with respectively complex masks, the production and application of which are expensive. Moreover, if propulsion plant blades are equipped with shroud band segments, it also becomes necessary due to strength and fit considerations to apply the coating only partially on those surface areas that are exposed to gases in the flow channel of the engine or propulsion plant. In addition to the substantial quantity of coating material that is deposited with loss on the masking surfaces, stray losses occur due to the coating of surfaces of the coating apparatus.

OBJECTS OF THE INVENTION

In view of the above it is the aim of the invention to achieve the following objects singly or in combination:

to provide a method and apparatus that will avoid the above problems, more specifically which will substantially reduce the losses of coating material;

to provide an apparatus and method which will permit or facilitate an economic recovery of coating material;

the invention also aims at providing a coating operation that will be uniformly reproducible so that the surface areas of a structural component that is to be coated partially, will have a coating of uniform thickness while surface areas not to be coated will be effectively protected against coating;

to avoid or at least reduce the application of coating material to component surfaces that are not to be coated nor to apparatus surfaces that are not to be coated; and to optimize the ratio of surface area to be coated to stray surface areas exposed to stray coatings, so that stray surface areas are minimized.

SUMMARY OF THE INVENTION

The apparatus according to the invention is characterized in that the structural components (2) are arranged on the outer circumference of a rotatable wheel (8) preferably having a horizontal drive axis (6) so that component surfaces (9) not to be coated are covered by a wheel disk and so that the component surfaces (10) that are to be coated project radially outside of the rotatable wheel (8).

The present method is characterized by the following steps. First, the structural components to be partially coated are secured to the wheel in such a way that the component surfaces not to be coated are covered by the wheel and the component surfaces to be coated project radially outwardly from the wheel. Second, surface areas (10) to be coated of two or three neighboring components (2) are so arranged and constructed that they form sidewalls of a reaction space (11) positioned between a masking or maskings and a source of the coating material, in an active reaction chamber (3). The volume of the reaction space is enriched by a coating medium for performing a coating operation. Third, the coating operation is then performed by rotating the wheel about its axis which is preferably arranged horizontally and simultaneously supplying coating material into the reaction chamber while the wheel is rotating.

The apparatus according to the invention has the advantage that an active reaction space (11), the volume of which can be enriched with coating medium or coating material, is kept optimally small and that its walls are substantially formed of component surfaces that are to be coated, whereby stray losses of coating material are minimized. To the extent that masks or screens form part of the active reaction space (11), these screens are arranged close to the source of coating material and close to the surfaces to be coated so that any coating layers formed on these masks have advantageously large coating thicknesses on surface areas which are simultaneously minimally small so that it becomes economical to recover the coating material from these small areas.

Due to the arrangement of the components on the outer circumference of a wheel that is rotatable about its axis, preferably its horizontal axis, it is advantageously achieved that on the one hand the volume of the active reaction space is reduced to the spacing between two or three neighboring structural components and that on the other hand all components on a wheel or all component groups on a wheel can be expeditiously moved through the active reaction space in sequence by the rotation of the wheel. Another important advantage is seen in the fact that the screening or masking of surface areas not to be coated is achieved substantially in a simple and effective manner by the wheel itself. A masking or jacketing or other application of a protective coating on surfaces to be protected against a deposition of coating material is avoided because the protection is achieved by simply inserting the components into the wheel, preferably at least one pocket facing radially outwardly from the wheel circumference.

Where angled structural components or components with an integral skirt, with flanges, jackets, or with ring segments are to be coated, it is possible to arrange such components in rim of the wheel in such a manner that the surfaces to be coated form with respective surfaces of neighboring components partially or completely a third wall of the reaction space inside a reaction chamber. For this purpose a second leg of an angular component having two legs is used. Similarly, the second leg of a flange or the jacket or ring section is positioned either tangentially or circumferentially relative to the wheel circumference. Thus, these integral elements of neighboring structural components on the wheel form advantageously the third wall of the active reaction space (11) which in that case is not formed by a sector of the wheel circumference, but rather completely of structural components to be coated. As a result, the surfaces to be coated are relatively large compared to screen or mask surfaces in the active reaction chamber, which is an advantage because any stray coated surfaces are thereby minimized.

Preferably, at least one heating source or heater is arranged in one of the remaining walls of the reaction chamber. This heater heats the surfaces to be coated to a temperature which serves two purposes. First, the elevated temperature makes it possible, following a preliminary cleaning, to remove any contaminations by steam. Second, the preheating brings the surfaces to be coated to a temperature which advantageously facilitates the adhesion of the coating medium on the preheated surfaces to be coated. During the operation of the heater it is possible to protect the source of coating material with the help of an adjustable masking or screen to prevent an undesirable contamination of the source of coating material. According to another aspect of the invention, it is advantageous to provide a sputter cleaning or a sputter etching by means of bombarding the respective surfaces through the source of coating material causing an inert gas ion bombardment while simultaneously preheating the surfaces to be coated by the heater. With this arrangement of the heater, the advantage is achieved that directly after the heating of the surfaces to be coated of even during the heating a coating cycle for the same surface being heated can be performed. Another advantage is seen in that the active reaction space (11) can be compact due to the arrangement of the heating source outside thereof in the reaction chamber or in a wheel housing.

According to another aspect of the invention the heater can be advantageously switched on for the recovery of coating material. For the coating material recovery the neighboring structural components are replaced by cooling elements that form the side walls of the active reaction space in a recovering cycle. These cooling elements are provided with adsorption surfaces for the coating material that has been previously deposited on masks and on a wheel circumferential sector.

In another preferred embodiment of the present apparatus at least one measuring sensor (33) is arranged on at least one of the remaining walls of the active reaction chamber (3) or preferably the reaction space (11). Such measuring sensors measure the coating temperature or the reaction temperature. Different types of sensors may be used for measuring the deposition rate or the coating thickness. Preferably and advantageously the sensors are arranged on a mask that forms a wall so that additional wall surfaces for the arrangement of the sensors are avoided which has the further advantage that the cleaning or recovery effort and expense is further reduced. Another advantage of the positioning of the sensors as claimed herein is seen in that the sensors are positioned very closely spaced from the surfaces being coated which results in a compact structure and has the further advantages that erroneous measurements are minimized.

One of the walls of the active reaction chamber (3) or preferably of the reaction space (11) may preferably be provided with at least one opening for a pyrometric temperature measurement. This opening cooperating with a pyrometric temperature sensor makes it advantageously possible to perform the temperature monitoring of the source of coating material in a contactless manner. The same applies to ascertaining or monitoring the temperature of the surfaces to be coated or even to the temperature of a built-in heating source. The opening for the pyrometric temperature sensing can be very small so that any stray loss of coating material remains insignificant.

Another preferred embodiment of the present apparatus is seen in that a carrier wheel is particularly suitable for accommodating or carrying structural components in the form of propulsion plant blades since these blades can be inserted with their foot into simple recesses or pockets arranged on the circumference of the carrier wheel. The arrangement also permits closely crowding the feet of the blades next to each other so that two advantages are achieved. First, expensive masks having a complicated configuration for avoiding the coating of the blade feet and of the radially inwardly facing surfaces of the blade platform between the vane proper and the blade feet have been obviated. Second, a uniform coating of the vanes and the radially outwardly facing surfaces of the platforms is assured. The blade feet fit into the recesses in the wheel circumference, whereby radial displacements of the blades are avoided. Yet another advantage is seen in that axial displacements can be easily avoided by locking segments that are readily installed.

In yet another embodiment the present carrier wheel has a configuration and dimensions where the structural components are installed, such that this configuration and dimensions correspond to the configurations and dimensions of an actual rotor disk. It is, for example, very advantageous to use a discarded rotor disk of a propulsion plant stage. Another very economical way of producing the carrier wheel is to make it of relatively inexpensive materials, e.g. plastics material, that are used for making rotor disk samples. These features are especially advantageously applied to the partial or selective coating of turbine blades having radially outwardly facing platform surfaces and/or having radially inwardly facing undersides of an integral shroud band element. For such structural components the just described modification of the present apparatus permits the selective or partial coating in one operational sequence or cycle.

In another embodiment of the present invention the wheel is constructed as a flat hollow cylinder. The "flat" hollow cylinder has a cylindrical ring jacket with a short axial length which has the advantage that the ring jacket can be provided with cut-outs or recesses or pockets having any desired configuration, whereby structural components of any desired configuration may be partially coated. In case propulsion plant blades are to be partially coated, the outer dimensions of the hollow cylinder are preferably those of an actual rotor disk.

A preheater (60) is preferably arranged outside the active reaction space (11) for preheating neighboring structural components of a component group or set. Such an arrangement has the advantage that contaminations of the coating material source are positively avoided because the heater and the coating material source are arranged in different circumferential positions of the wheel. It is especially preferred to arrange a preheater for drying, preheating, or outgassing the surfaces of neighboring structural components, in radial symmetry opposite to the active reaction space (11). This diametrical arrangement of the preheater and the coating material source opposite each other achieves the largest spacing between the two components which minimizes any contamination danger. Even though the source (12, 13) of coating material and the heater are spatially separated from each other it is still advantageously possible to preheat the structural components while simultaneously other components in another position on the circumferential rim of the wheel are being coated. If, in addition to the preheater an inert gas ion source with an ion accelerator is provided, it is possible that the preheating can be combined with an ion cleaning or with an ion etching of the surfaces to be coated.

By arranging the structural components to be rotatable about a component axis on the circumference of the wheel it is possible to further improve the coating results and make the coating thickness uniform throughout the coated surface area. A rotation of the individual component or group of components can advantageously be continuous or at intervals during a coating cycle so that the surfaces to be coated that project outside the wheel are repeatedly and uniformly coated.

For the partial coating of components that have radially outer surface areas that must not be coated, the present apparatus is preferably equipped with a cover ring that protects these radially outer surface areas of the components against coating. The cover ring is so positioned that it fully covers the radially outwardly facing surface areas that must not be coated. If the cover ring is stationary, there is a sliding contact between the radially outwardly facing surfaces of the components on the wheel and the cover ring. If the cover ring forms a hoop around the components, it will rotate with the components on the wheel. A cover ring or ring mask may be used with special advantage if the set or group of components to be coated preferably comprises propulsion plant blades with shroud band segments, whereby the radially outer surfaces of the shroud band segments are provided with a covering. Thus, it is advantageously possible to only coat the blade itself, the upper surface of the platform, and the under or radially inwardly facing surface of the shroud band segment.

The coating material source is preferably a movable cathode sputterer or a movable vapor deposition source, whereby the cathode sputterer is movable at least in one direction of space which may, for example, extend radially from the axis of the wheel shaft (6) so that these sources may have a relatively small radiation or evaporation surface which is limited by the size of the intermediate space between two neighboring structural components. Nevertheless, large structural component surfaces can be effectively coated by the radial displacement of the cathode sputter or by the evaporator source.

A further modification of the present apparatus is provided by positioning two cathode sputterers or evaporator sources directly opposite each other since the coating material deposits itself only in marginal zones of these sources and because the coating material is radiated directly back into the active reaction space (11) in the area of the respective radiation surfaces of the opposite sources (12, 13). Thus, the radiating surfaces advantageously keep each other free of coating material.

The coating source such as a cathode sputterer or a vaporizer source is preferably constructed to be rotatable or tiltable about at least one axis in space where the structural components to be partially coated have a spherically curved configuration. Making the coating material source rotatable or tiltable then has the advantage that the source can be adapted by its rotation or tilting to the curvature of the component surface to be coated to thereby achieve uniform coating thicknesses.

The method according to the invention has the advantage that the assembly or insertion of the components into the wheel can be performed efficiently and quickly since less time is needed for this work than the production and mounting of individually tailored masks and sheet metal screen elements. The present assembly even requires less time than the conventional application of protective coverings on those surfaces that shall not be coated. Furthermore, the positioning of two or three neighboring components into the coating position by means of rotating the wheel either continuously or stepwise with a programmed stepping motor is advantageous because it is efficient and can be simply performed preferably with a stepwise cycling rotation. Another advantage is seen in the fact that relative thick coatings are produced on the passive, small surface, areas of the screens or masks so that the recovery of coating material is economically possible.

Where a continuous rotation of the wheel is preferred, the masks or screens for the axial limitation of the active reaction space (11) are so arranged that the screens or masks cover four neighboring component positions. With this arrangement two or three neighboring components laterally limit the active reaction space (11) when the wheel rotates. Where a stepwise rotation of the wheel is performed it is sufficient for the masks that provide the axial limitation of the active reaction space (11) are arranged to cover a sector over just two neighboring component positions provided that during the stepping the coating source is switched off.

Further, when a stepping advance of the wheel is employed, each angular step must cover a sector corresponding to the respective component position. Thus, if the wheel carries, for example 50 components, the wheel will make 50 steps for each revolution. At least one full revolution is performed for a coating operation.

It has been found to be advantageous to rotate the components about a component axis in addition to rotating the wheel about the wheel axis. This feature enables maintaining a relatively small and limited active reaction space while still assuring a high uniformity of the coating quality. The rotation of the individual components about their respective axis can be varied in accordance with the configuration of the components, for example if the components do not have a rotational symmetry.

The coatings here involved preferably apply precious metals, because the economic advantages of the invention are especially noticeable when precious metals are applied by spraying, sputtering or in a vapor deposition, since the recovery of stray proportions of the precious metals becomes feasible. Even if small layer thicknesses are involved, the recovery of precious metal is economical. The precious metals involved are preferably platinum or alloys thereof applied to propulsion plant blades made of super alloys. Propulsion plant blades have been found to be especially effective in limiting the active reaction space (11) laterally so that stray losses of platinum that cannot be recovered are minimized.

A preferred method for applying the coating is the sputtering deposition under reduced pressure. In the sputtering operation the material of a source cathode is bombarded with inert gas ions that sputter the cathode material and transport the material onto the surfaces to be dated. However, vapor deposition is equally suitable for performance by the present method wherein solid source material is vaporized by a laser beam in a low or high vacuum chamber, whereby the source forms one of the side walls of the active reaction space (11).

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
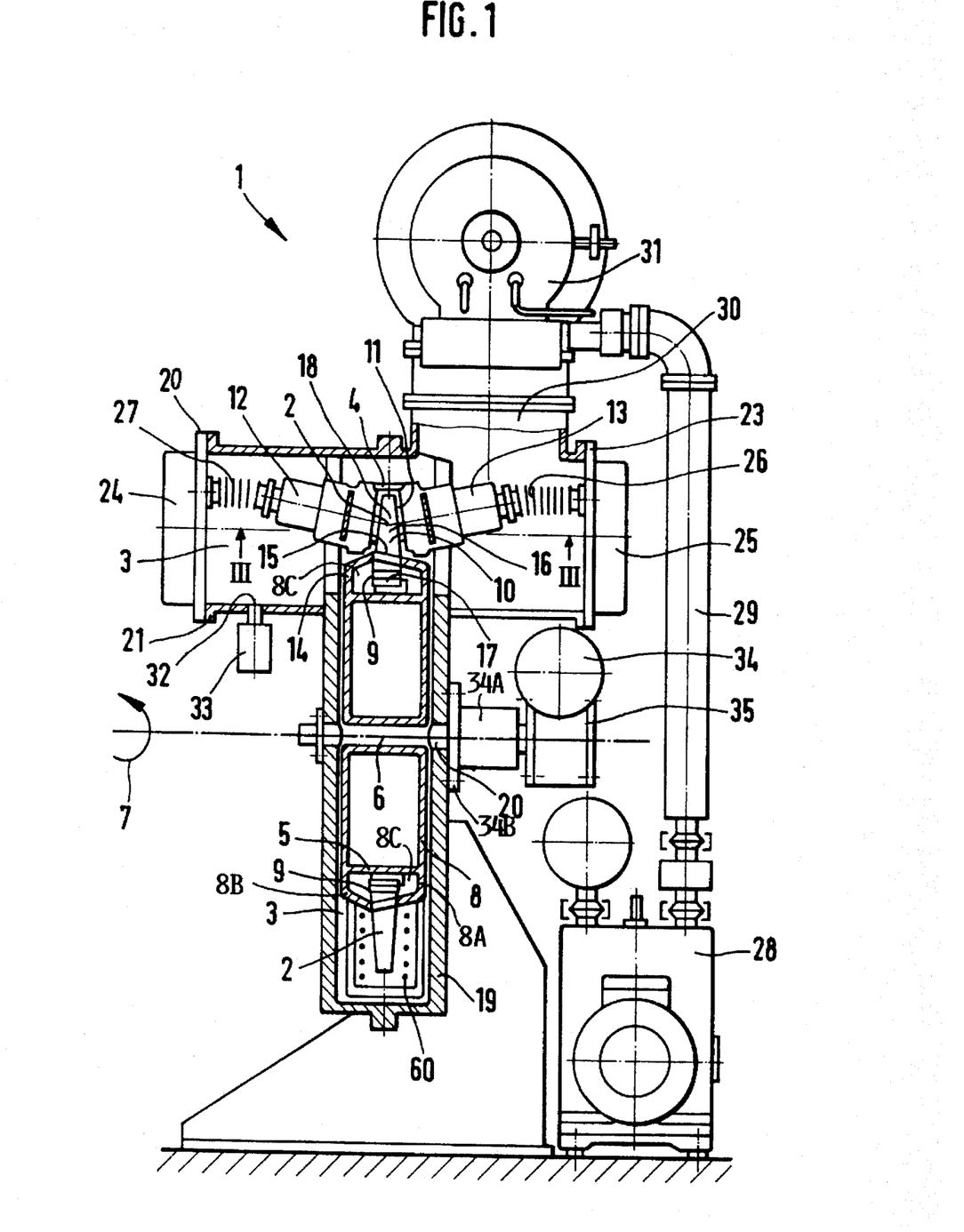
FIG. 1 illustrates an apparatus according to the invention for the partial coating of structural components.

FIG. 1 shows an apparatus for the partial coating of structural components (2) which are assembled as sets or groups of components in a reaction chamber (3) also referred to as coating chamber (3) in a coating housing section (21). The components (2) have first surface areas (10) to be coated and second surface areas (9) not to be coated. Thus, care must be taken to avoid coating the second surfaces (9). According to the invention, portions of the surface areas (9) not to be coated are protected by the arrangement of the components (2) themselves, while other surface portions not to be coated are protected by screens or masks (4, 14). For this purpose the components (2) are arranged partly in a radially open pocket (8C) of a rim around the outer circumference (5) of a wheel (8) mounted on a shaft or axis (6) for rotation in the direction of an arrow (7). Preferably, the rotational axis of the shaft or axle (6) extends horizontally. Still further portions of the surfaces (9), not to be coated, are covered by radially outer rim portions (8A, 8B) of first and second wheel disks forming the pocket or pockets (8C). The surface areas (10) to be coated, extend radially outside of the disks of the wheel (8). The arrangement is such that surfaces, which face each other, of two or three neighboring structural components (2) of a set or group form circumferentially facing side walls of an active reaction space (11), the volume of which can be enriched by coating medium provided by respective sources (12, 13) as will be described below. These two facing surfaces of neighboring components (2) form first and second surfaces of the coating or reaction space (11) inside the coating chamber 3.

A third wall of the coating space (11) is formed as a ring having its center in the axis (6) and passing with its mantle portions (40) (FIG. 2) radially outwardly through planes (42) (FIG. 2) of contact between neighboring components (2) of a set or group of such components. Fourth, fifth, and sixth walls of the reaction or coating space (11) are formed by at least one surface that is part of a coating source (12 or 13) and by masks (4 or 14). If two coating sources (12 and 13) are used, then only one circumferential mask (4) is necessary to close the space (11) radially outwardly. However, if only one coating source (12 or 13) is used, then two masks (4 and 14) are required, whereby mask (4) again forms a circumferential wall while mask (14) forms an axially facing wall of the space (11).

In the example shown in FIG. 1, two coating sources (12 and 13) are used and positioned opposite each other, one on each side of the wheel (8) in the housing (21). Thus, axially facing surfaces of the coating sources (12 and 13) form axially facing walls of the active reaction space (11), whereby large masking surfaces for the active reaction space (11) are avoided. This arrangement has the important advantage that any coating material from the coating source (12) that may be deposited on the surface of the coating source (13) is again evaporated or sputtered by the source (13) and vice versa. In both instances, the stray loss is minimized since the material is beamed back, so to speak, into the active reaction space (11).

Figure 2:
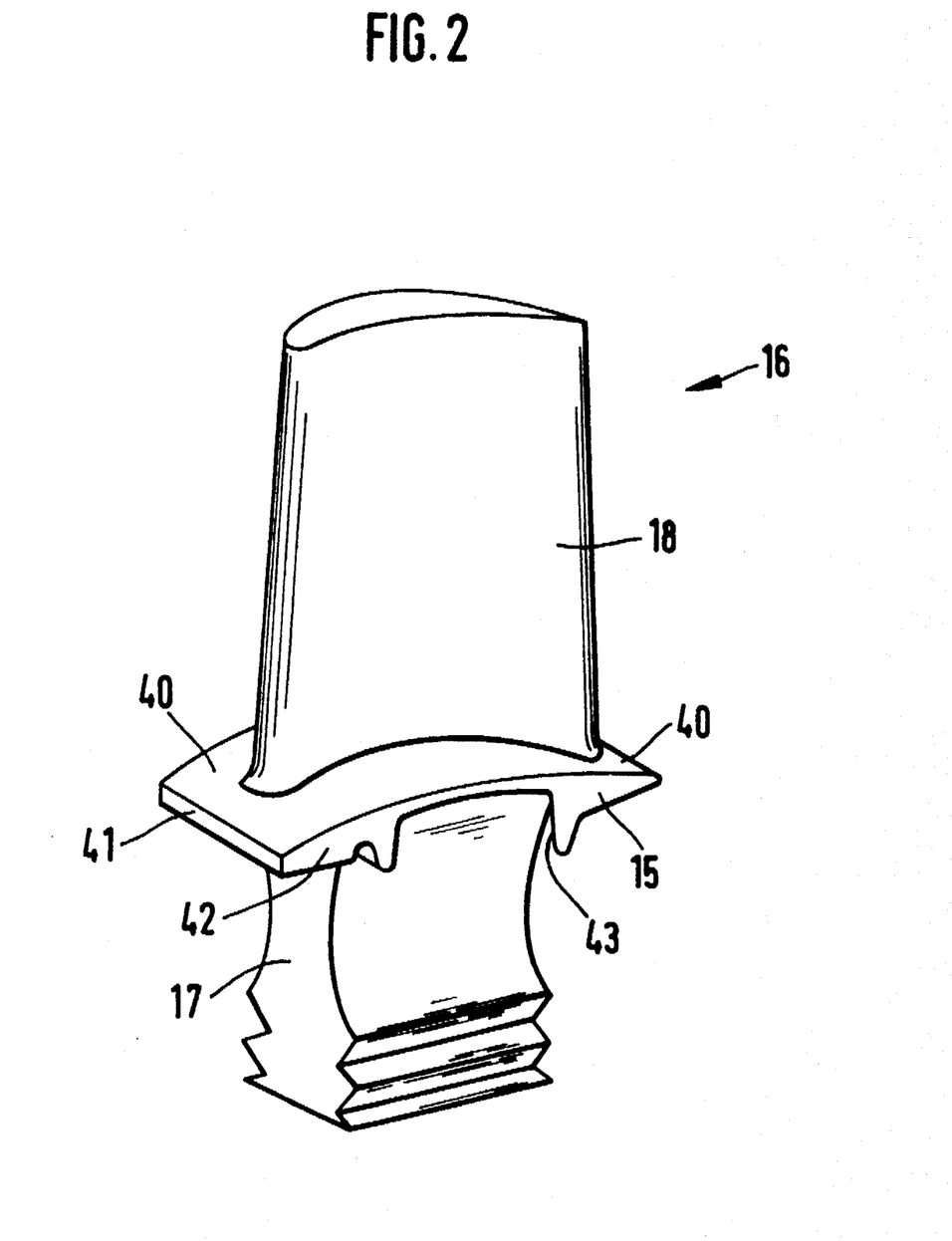
FIG. 2 illustrates a turbine blade representing an example of a structural component that can be efficiently coated in accordance with the invention.
Figure 3:
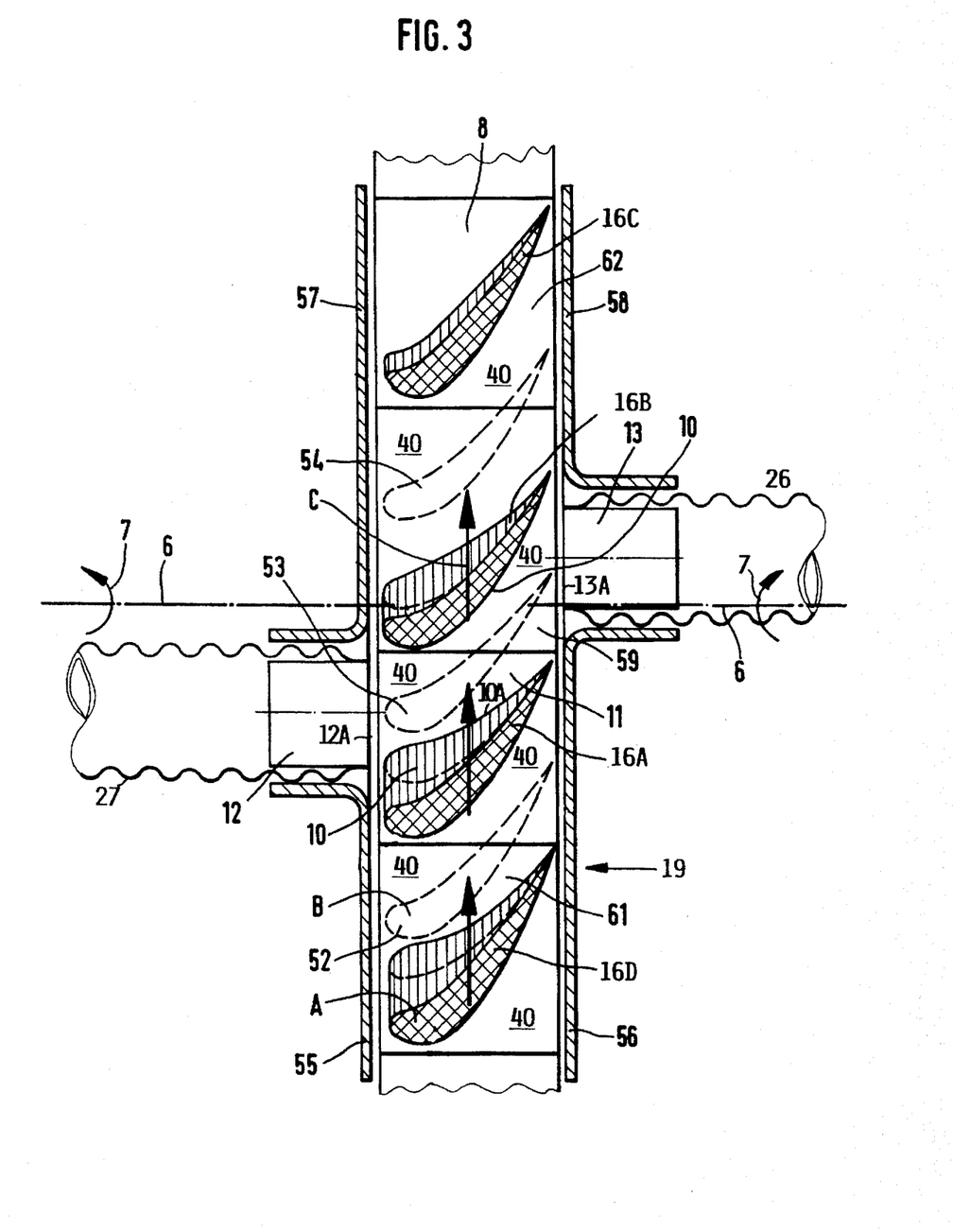
FIG. 3 shows on an enlarged scale a plan view partially in section of the active reaction space of the apparatus according to the invention, whereby the view direction III—III is shown in FIG. 1.

FIG. 2 shows a propulsion blade (16) as an example of the structural components 2. The blades (16) comprise a blade foot (17) below a platform (15) and a vane (18) above the platform (15). The wheel (8) is so dimensioned that the platforms (15) of all neighboring blades (16) on the wheel (8) form with their radially outwardly facing platform surface portions (40) a closed circumferential ring mantle which faces radially outwardly. After the positioning of the blades (16) in a circumferential pocket of the wheel (8), the outer surface portions (40) of the platform (15) form the above mentioned third wall as a bottom of the active coating space (11), as shown in FIG. 3. Thus, in this example embodiment the only stray coating receiving surface is the mask (4). The total surface area of the mask (4) is substantially smaller than the total useful surfaces that do not receive any stray coating. As a result, the ratio between the sum of the useful surfaces and the stray surface is most advantageous.

Two housing sections (19 and 21) form two chambers. The coating chamber (3) is substantially enclosed by the housing section (21). A wheel housing section (19) forms a wheel chamber for the wheel (8) which is mounted with its axle (6) through bearings (20) for rotation in the housing section (19). The coating housing section (21) comprises flanges (20 and 23) for covers (24 and 25) which carry the coating sources (12 and 13) preferably in a movable manner. These covers comprise through-sleeves or through-bushings for any power supply not shown. Preferably, the coating sources (12 and 13) are mounted for movement in response to a mechanical drive. To permit such motion in at least one axis of space a flexible bellows (26 and 27) connects the respective covers (25 and 24) to the corresponding coating medium source (13 and 12). The wheel housing section (19) and the coating housing section (21) are preferably evacuable by a vacuum pump (28) through a vacuum duct (29) flanged to a port (30) of the housing section (21). If desired, a turbo-molecular-pump (31) may be connected to assist the vacuum pump (28) as shown in FIG. 1. Both pumps will be used, if it is desired to establish a high vacuum in the chamber (3). A vacuum pressure sensor and control device (33) is connected with the chamber (3) through a port (32) in the wall of the housing section (21).

As shown in FIG. 1 at the bottom thereof, a heater (60) is positioned in the wheel housing (19) for heating the structural components (2). The heater (60) is arranged in radial symmetry to the coating sources (12 and 13). Stated differently, the heater (60) is positioned diagonally opposite of the sources (12 and 13).

Referring further to FIG. 1, the wheel (8) is driven by a motor (34) through a gear (35) driving the shaft or axle (6). The motor (34) and the gear (35) are flanged to the housing (19) by a bearing box (34A) with a flange (34B).

In connection with the coating of propulsion plant blades (16), shown in FIG. 2, care must be taken that only the surfaces of the vane (18) and the radially outwardly facing upper surface portions (40) of the platform (15) are being coated and that the blade foot (17) and the lateral surfaces (41) and the contact surfaces (42) as well as the radially inwardly facing surfaces (43) of the platform (15) are not coated. The apparatus according to the invention achieves these conditions efficiently, because only the vanes (18) and the upwardly facing surface portions (40) of the platform (15) are exposed to the coating sources (12 and 13) since the surfaces (42) of neighboring blade platforms (15) contact each other, thus enabling the upwardly or radially outwardly facing surface portions (40) of the platforms (50) to form the above mentioned third wall of the active reaction space (11). The foot (17) is further protected against being coated because the axially facing surfaces (41) of the platforms (15) are covered by the lateral disks (8A, 8B) of the wheel (8). An especially good protection of all surfaces below the surface portions (40) is achieved if the wheel (8) comprises on its circumference pockets adapted to receive the feet (17) as in an actual rotor disk of a propulsion plant or turbine.

FIG. 3 shows on an enlarged scale compared to FIG. 1 a plan view, partially in section approximately in the direction of the arrows III—III in FIG. 1. This view illustrates the active reaction space (11) between two neighboring blades (16A and 16B). Blade (16C) is a neighbor to blade (16B) and blade (16D) is a neighbor to blade (16A). In the embodiment of FIG. 3 the two coating sources (12 and 13) are arranged on opposite sides of the wheel housing (19) and the sources (12 and 13) face axially, however these sources are radially displaced to a different extent from the central axis (6) to be effective in different sections of the coating space (11). The blades (16A to 16D) are shown in full line positions A while blades (52, 53, and 54) are shown in dashed line positions. The blades (52, 53, 54) in the dashed line positions are on the backside of the wheel and will come into the full line positions as the wheel rotates in the direction C. The active coating space (11) is formed in the full line position A of the blade (16A and 16B), whereby the surfaces (10 and 10A) to be coated form the above mentioned first and second walls of the space (11) in the circumferential direction of the wheel (8). The above mentioned third wall is shown at (59) and is formed By the respective radially outwardly facing platform surface portions (40) of the blades (16A and 16B). Further, the space (11) is laterally or rather axially enclosed by the surfaces (12A and 13A) of the respective coating sources (12 and 13). These surfaces (12A and 13A) form the fourth and fifth surfaces of the space (11). The circumferentially extending mask (4) covering the space (11) radially outwardly is not seen in FIG. 3 but forms the sixth wall of the coating space (11).

An upstream chamber (61) is formed between the two blades (16A and 16D). A downstream chamber (62) is formed between the two blades (16B and 16C). The term "upstream" and "downstream" has reference to the direction C of rotation of the wheel (8). The walls (55 and 56) of the wheel housing (19) close the upstream chamber (61) in the axial directions. Similarly, the walls (57 and 58) close the downstream chamber (62) in the axial direction. Both chambers (61 and 62) are closed radially outwardly by the masks (4) seen in FIG. 1. The upstream chamber (61) and the downstream chamber (62) act as a sluice for the active reaction space (11), thereby limiting the active reaction space (11) circumferentially of the wheel to three neighboring component positions at the most.

In the dashed line position B the reaction space (11) comprises the space between three neighboring components (52, 53, and 54), whereby the surfaces to be coated of the components (52 and 54) form the side walls of the active reaction space (11) in the circumferential direction. The long masks (55 and 56) of the upstream chamber (61) and the long masks (57 and 58) of the downstream chamber (52) make sure that with a continuous rotation of the wheel (8) about its axis (6) in the direction of the arrows (7) the active reaction space (11) has small wall surfaces. In this example, the coating sources (12 and 13) are cathode sputterers, which sputter precious metals onto the surfaces (10, 10A) to be coated. Further, in this embodiment the surface portions (40) form a bottom (59) of the active space (11) and this bottom (59) is to be coated.

EXAMPLE

The present method is performed by way of an example as follows. Propulsion plant blades (16) are inserted radially into a receiving pocket of a wheel (8) that is formed as an imitation of an actual propulsion plant rotor disk. The blades (16) are to be partially coated with platinum. Due to the insertion according to the invention the blade feet (17) are not going to be coated because the lateral disks (8A, 8B) of the wheel (8) cover these feet as best seen in FIG. 1. However, the vanes (18) of the blade (16) protrude radially outwardly from the wheel (8) and will thus be coated. After the insertion of the blades (16) into the wheel (8) is completed, the wheel is rotated about its axis (6) to bring the surfaces (10, 10A) to be coated and forming part of two or three neighboring blades (16), into positions where they form side walls (10, 10A) of an active reaction space (11). Once the blades are positioned as shown in FIG. 3, a coating cycle is performed. For this purpose the components (16) are brought to a temperature in the range of about 200° C. to about 700° C. The heat is provided by the heater (60) shown in FIG. 1. Through sliding contacts, not shown, the rotation of the wheel (8) will connect the components to be coated to a voltage in the range of 50 to 200 volts. The discharge voltage of the sources (12 and 13) is adjusted to a range of 200 to 1000 volts to assure the intended cathode sputtering. The sputtering power is maintained within the range of 10 to 50 Watts per $cm^2$ under a pressure in the reaction space 11 of 0.1 to 5.0 Pascal. The coating is then continued until the coating layer of platinum on the surfaces (10) to be coated, is within the range of up to 2 μm. The components of the wheel (8) are brought sequentially into the position where they form the active reaction space (11) by the continuous rotation of the wheel (8) so that one set of surfaces facing each other across the space (11) is coated by the sputtering. The layer thickness and temperature in the active reaction space (11) is monitored by sensors (33) connected through a port (32) to the chamber (3) as shown in FIG. 1. An operator or a program control then provides the required adjustments in response to the sensors (33) to achieve the desired coating thickness. Instead of a continuous rotation of the wheel (8), it is also possible to rotate the wheel (8) stepwise until all components carried by the wheel (8) have been properly coated. The duration of such a coating cycle depends on the number of components on the wheel and on the number of groups or sets of components on the wheel. Such duration may be within the range of 5 minutes to 5 hours.

The diameter of the wheel (8) is within the range of 0.5 to 2.0 m, while the vane portions (18) of the components (16) extending radially outside the confines of the wheel (8) have a length within the range of 50 to 500 mm. The axle (6) of the wheel (8) may be adjustably mounted in the housing (19) by the flange mount (34A, 32B) for adapting the circumference of the wheel (8) to the active reaction space (11) in the housing (19).

Although the invention has been described with reference to specific example embodiments, it will be appreciated that it is intended to cover all modifications and equivalents within the scope of the appended claims.

What is claimed is:

1. An apparatus for the partial coating of structural components having first surface areas to be coated and second surface areas not to be coated, comprising a carrier wheel for holding said components, said carrier wheel having a rotational axis about which said carrier wheel is rotatable, first and second wheel disks forming at least one radially open wheel pocket for insertion of said structural components into said pockets so that said first surface areas extend radially outwardly from said pockets for coating in a coating chamber when said carrier wheel carries said components through said coating chamber, and so that said second surfaces are protected in said at least one pocket against coating.

2. The apparatus of claim 1, further comprising a housing (19, 21) enclosing said coating chamber through which said wheel can rotate, at least one source (12, 13) of coating material having a source surface axially facing said carrier wheel (8), masking means (4, 14) positioned in said housing (19, 21) so that an individual coating space (11) is enclosed between the following six walls: first and second walls are formed by two of said first component surfaces (10, 10A) facing each other on two neighboring components on said carrier wheel (8), a third wall (59) is formed circumferentially around said carrier wheel between said first and second walls (10, 10A), a fourth or fifth wall is formed by one or two surfaces (13A, 12A) of said source, and two or one further walls are formed by a surface of said masking means (4, 14).

3. The apparatus of claim 2, further comprising an upstream chamber (61) formed upstream of said individual coating space (11) and a downstream chamber (62) formed downstream of said individual coating space (11) as viewed in the direction of rotation (C) of said carrier wheel (8), two further structural components forming with component surfaces to be coated, walls of said upstream and downstream chambers (61, 62) in a circumferential direction of said carrier wheel, said apparatus further comprising masking walls (55, 56; 57, 58) laterally closing said upstream and downstream chambers (61, 62).

4. The apparatus of claim 2, wherein said structural components (16) have radially outwardly facing wall surface portions (40) forming said third wall as surfaces to be coated (59).

5. The apparatus of claim 2, further comprising at least one heater (60) arranged for heating at least one of said further walls forming part of said individual coating space.

6. The apparatus of claim 2, further comprising at least one measuring sensor (33) positioned for measuring at least one operating condition in said coating space (11).

7. The apparatus of claim 6, further comprising at least one opening (32) and wherein said measuring sensor is a pyrometric sensor positioned for pyrometric temperature sensing through said opening.

8. The apparatus of claim 2, further comprising a preheater (60) positioned in said housing outside said individual coating space (11) for preheating neighboring components (2, 16) of a component group on said carrier wheel.

9. The apparatus of claim 8, wherein said preheater (60) is positioned radially or diametrically opposite said individual coating space (11) for drying, preheating, or outgassing surfaces of neighboring components on said carrier wheel (8).

10. The apparatus of claim 2, wherein the coating source (12, 13) comprises a cathode sputterer movable at least in one direction of space or a vapor deposition source movable at least in one direction of space.

11. The apparatus of claim 10, wherein said cathode sputterer or a vapor deposition source is mounted tiltably for tilting about at least one axis in space.

12. The apparatus of claim 1, wherein said carrier wheel (8) with its wheel disks (8A, 8B) comprises the configuration of a rotor disk and wherein said structural components to be coated comprise rotor blades of a propulsion plant.

13. The apparatus of claim 1, wherein said components are mounted rotatably about a component axis on the circumference of said carrier wheel (8), for an individual component rotation in addition to the rotation of the carrier wheel about its axis.

14. The apparatus of claim 1, further comprising a cover ring (4) for a component group to be coated, said ring (4) covering radially facing outer surface areas of said components of said group.

15. The apparatus of claim 14, wherein said component group to be coated comprises propulsion plant blades (16) provided with shroud band segments having radially outer surfaces, said apparatus further comprising a covering for preventing coating of said shroud band segments.

16. The apparatus of claim 1, wherein said carrier wheel (8) has an axis (6) of rotation extending horizontally.

\* \* \* \* \*

UNITED STATES PATENT AND TRADEMARK OFFICE
CERTIFICATE OF CORRECTION

PATENT NO. : 5,630,879
DATED : May 20, 1997
INVENTOR(S) : Eichmann et al.

It is certified that error appears in the above-indentified patent and that said Letters Patent is hereby corrected as shown below:

In Column 3, line 45, replace "of" by --or--.

Signed and Sealed this

Fourteenth Day of October, 1997

*Attest:*

BRUCE LEHMAN

*Attesting Officer*   *Commissioner of Patents and Trademarks*